United States Patent
Mizokami et al.

(10) Patent No.: US 10,305,533 B2
(45) Date of Patent: May 28, 2019

(54) SEMICONDUCTOR DEVICE

(71) Applicant: Renesas Electronics Corporation, Tokyo (JP)

(72) Inventors: Masakazu Mizokami, Tokyo (JP); Takao Kihara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/504,631

(22) PCT Filed: Aug. 25, 2014

(86) PCT No.: PCT/JP2014/072150
§ 371 (c)(1),
(2) Date: Feb. 16, 2017

(87) PCT Pub. No.: WO2016/030942
PCT Pub. Date: Mar. 3, 2016

(65) Prior Publication Data
US 2017/0244442 A1    Aug. 24, 2017

(51) Int. Cl.
*H04B 1/48* (2006.01)
*H03H 7/01* (2006.01)
(Continued)

(52) U.S. Cl.
CPC ............ *H04B 1/48* (2013.01); *H03H 7/0115* (2013.01); *H03H 7/42* (2013.01); *H03H 11/28* (2013.01)

(58) Field of Classification Search
CPC .... H04B 1/0057; H04B 1/044; H04B 1/0458; H04B 1/18; H04B 1/38; H04B 1/44;
(Continued)

(56) References Cited

U.S. PATENT DOCUMENTS 8,067,998 B2 *  11/2011  McKay .................... H01P 5/10
                                                          333/238
8,368,481 B2 *  2/2013   Jin ........................... H03H 7/42
                                                          333/101
(Continued)

FOREIGN PATENT DOCUMENTS

CN       103986493 A    8/2014
JP       2005-27184 A   1/2005
(Continued)

OTHER PUBLICATIONS

Japanese Office Action dated Oct. 10, 2017 in Japanese Application No. 2016-545100 with an English translation thereof.
(Continued)

*Primary Examiner* — Yuwen Pan
*Assistant Examiner* — Paul P Tran
(74) *Attorney, Agent, or Firm* — McGinn I.P. Law Group, PLLC

(57) ABSTRACT

In an RFIC provided in a semiconductor device according to an embodiment, a low-noise amplifier (41) for reception and a power amplifier (11) for transmission are connected to a common antenna connection terminal (5). Between the antenna connection terminal (5) and an LNA (41), a circuit (31) is connected to be used for impedance matching, and a semiconductor switch (SW1) is connected in parallel with the circuit (31).

5 Claims, 9 Drawing Sheets

(51) Int. Cl.
H03H 7/42 (2006.01)
H03H 11/28 (2006.01)

(58) Field of Classification Search
CPC ......... H04B 1/48; H04B 1/52; H01L 27/0251;
H01P 1/20345; H01P 5/02; H01P 5/10;
H03F 1/0205; H03F 1/08; H03F 1/52;
H03F 1/565; H03F 3/19; H03F 3/245;
H03F 3/45179; H03F 3/45475; H03F
3/60; H03H 7/0115; H03H 7/38; H03H
7/40; H03H 7/42; H03H 7/463; H03H
11/28; H01Q 1/002; H01Q 1/2283; H01Q
1/24; H01Q 1/242; H01Q 1/50
See application file for complete search history.

(56) References Cited

U.S. PATENT DOCUMENTS

| | | | | |
|---|---|---|---|---|
| 8,380,152 | B2* | 2/2013 | Liu | H04B 7/0808 455/277.2 |
| 8,472,894 | B2* | 6/2013 | Wang | H04B 1/52 327/356 |
| 2003/0155976 | A1* | 8/2003 | Weber | H01L 23/66 330/277 |
| 2005/0024162 | A1 | 2/2005 | Watanabe et al. | |
| 2008/0238569 | A1* | 10/2008 | Matsuo | H03H 7/40 333/32 |
| 2009/0017775 | A1 | 1/2009 | Qiao et al. | |
| 2010/0109798 | A1* | 5/2010 | Chu | H03H 7/38 333/124 |
| 2010/0259319 | A1* | 10/2010 | Chan | H03F 1/565 327/563 |
| 2013/0009704 | A1* | 1/2013 | Liao | H04B 1/52 330/253 |
| 2013/0078931 | A1* | 3/2013 | Jerng | H04B 1/0458 455/78 |
| 2014/0199951 | A1* | 7/2014 | Yu | H04B 1/44 455/83 |

FOREIGN PATENT DOCUMENTS

| | | |
|---|---|---|
| JP | 2014-090399 A | 5/2014 |
| JP | 2014-90402 A | 5/2014 |

OTHER PUBLICATIONS

International Search Report (ISR) (PCT Form PCT/ISA/210), in PCT/JP2014/072150, dated Oct. 21, 2014.
Kuhn, William B. et al., "A resonant switch for LNA protection in watt-level CMOS transceivers.", Microwave Theory and Techniques, IEEE Transactions on , vol. 53., No. 9, IEEE, Sep. 2005, pp. 2819-2825.
Chinese Office Action, dated Sep. 25, 2018, in Chinese Application No. 201480081520.8 and English Translation thereof.
Japanese Office Action, dated Dec. 18, 2018, in Japanese Application No. 2018-019581 and English Translation thereof.

* cited by examiner

SEMICONDUCTOR DEVICE

TECHNICAL FIELD

The present invention relates to a semiconductor device, which is, for example, suitably used for a radio-frequency integrated circuit (RFIC) for a radio communication device.

BACKGROUND ART

For front-end sections of traditional radio transceivers, many external parts, such as baluns, semiconductor switches, and matching circuits, have been used. Many of these external parts, however, are being replaced by on-chip parts to reduce cost, save space, and so on.

For example, US Patent Application Publication No. 2013/0078931 (PTD 1) discloses a transmitting-receiving front end having a balun and a semiconductor switch that are integrated on-chip. As described in FIG. 2 of PTD 1, the transmitting-receiving front end includes a low-noise amplifier (LNA), a power amplifier (PA), a transformer (balun), a semiconductor switch, a matching circuit, and an antenna. Among these, the matching circuit and the antenna are external parts, and the others are on-chip parts.

Specifically, a differential signal output from the power amplifier is converted into a single-ended signal by the transformer. An output signal of the transformer is supplied to the antenna through the matching circuit. A signal received by the antenna, on the other hand, is input to the low-noise amplifier through the matching circuit and the semiconductor switch. The semiconductor switch is switched off at a time of a transmission operation, and is switched on at a time of a reception operation.

CITATION LIST

Patent Document

PTD 1: US Patent Application Publication No. 2013/0078931

SUMMARY OF INVENTION

Technical Problem

With the configuration of the front end shown in aforementioned PTD 1, a signal received by the antenna is input to the low-noise amplifier through the semiconductor switch. Accordingly, there is a problem of deterioration in receiving sensitivity due to an insertion loss of the semiconductor switch.

Contrary to the above-described configuration, if a semiconductor switch is provided not between the antenna matching circuit and the low-noise amplifier but between the antenna matching circuit and the transformer, the semiconductor switch is switched on at a time of transmission and is switched off at a time of reception. In this case, transmission efficiency is decreased due to an insertion loss of the semiconductor switch, leading to an increase in power consumption of the power amplifier.

Other objects and novel features will become apparent from the description of the present specification and the accompanying drawings.

Solution to Problem

In an RFIC provided in a semiconductor device according to an embodiment, a receiving unit and a transmitting unit are connected to a common antenna connection terminal. Between the antenna connection terminal and the receiving unit, a circuit to be used for impedance matching is connected, and a semiconductor switch is connected in parallel with this circuit.

Advantageous Effects of Invention

According to the aforementioned embodiment, a deterioration in receiving sensitivity and a decrease in transmission efficiency can be prevented.

DESCRIPTION OF EMBODIMENTS

Figure 1:
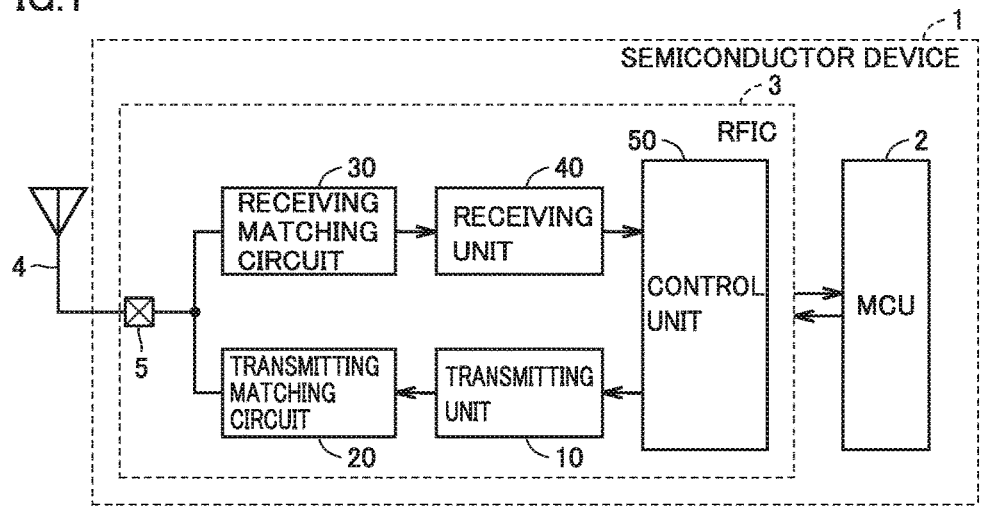
FIG. 1 is a block diagram showing a configuration of a semiconductor device according to a first embodiment.

Hereinafter embodiments will be described in detail with reference to the drawings. Identical or equivalent components are denoted by identical reference characters and the description thereof will not be repeated in some cases.

First Embodiment

[Schematic Configuration of Semiconductor Device]

FIG. 1 is a block diagram showing a configuration of a semiconductor device according to a first embodiment. With reference to FIG. 1, a semiconductor device 1 is used for a radio transceiver. Semiconductor device 1 is a device into which semiconductor chips, such as a micro-controller unit (MCU) 2 and a radio-frequency integrated circuit (RFIC) 3, are packaged.

MCU 2 includes components such as a central processing unit (CPU), a random access memory (RAM), a read only memory (ROM), and an interface circuit. MCU 2 outputs data, which is to be transmitted to an external component, to RFIC 3 and receives data, which is externally received, from RFIC 3. Further, MCU 2 controls the blocks constituting RFIC 3.

RFIC 3 is an integrated circuit (IC) for radio communication using radio frequency (RF) waves. As shown in FIG. 1, RFIC 3 includes a transmitting unit 10, a transmitting matching circuit 20, a receiving matching circuit 30, a receiving unit 40, a control unit 50, and an antenna connection terminal 5. To antenna connection terminal 5, an antenna 4 is electrically connected.

Transmitting unit 10 converts a baseband transmission signal that is output from control unit 50, into a radio-frequency transmission signal. Transmitting matching circuit 20 is a circuit for performing impedance matching of antenna 4. Impedance matching refers to an adjustment of impedances between radio-frequency circuits having different impedances and connected to each other, to provide a maximum supply power. A radio-frequency transmission signal output from transmitting unit 10 is supplied to antenna 4 through transmitting matching circuit 20.

Receiving unit 40 converts a radio-frequency reception signal that is received by antenna 4 into a low-frequency baseband reception signal. Receiving matching circuit 30 is a circuit for performing impedance matching of receiving unit 40. A baseband reception signal generated at receiving unit 40 is input to control unit 50.

Control unit 50 modulates a baseband transmission signal to be output to transmitting unit 10, and demodulates a baseband reception signal that is received from receiving unit 40. Further, control unit 50 controls operations of transmitting matching circuit 20 and operations of receiving matching circuit 30.

[Configurations of Matching Circuits]

Figure 2:
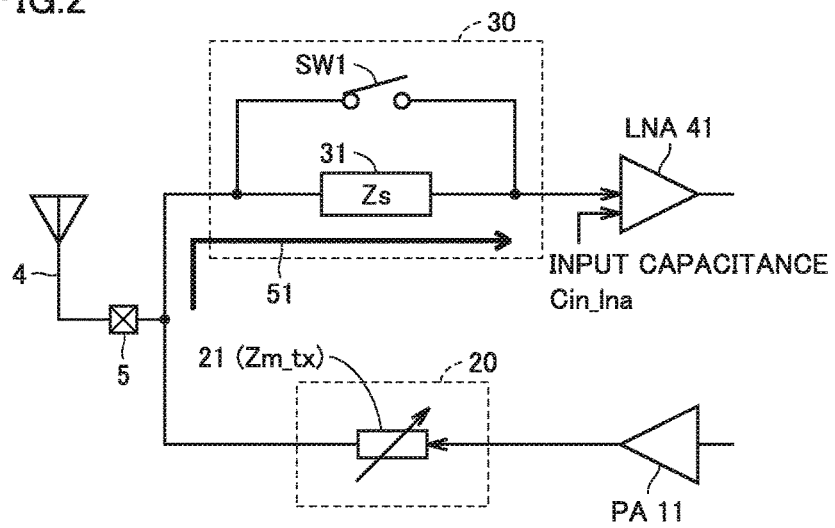
FIG. 2 is a block diagram showing a further detailed example configuration of the front-end section of FIG. 1.

FIG. 2 is a block diagram showing a further detailed example configuration of the front-end section of FIG. 1. FIG. 2 shows a power amplifier (PA) 11 provided in the final stage of transmitting unit 10, and a low-noise amplifier (LNA) 41 provided in the first stage of receiving unit 40, in addition to antenna 4, antenna connection terminal 5, transmitting matching circuit 20, and receiving matching circuit 30 of FIG. 1. At a time of a transmission operation in the RFIC, power supply to LNA 41 is OFF (power supply to PA 11 is ON), while at a time of a reception operation in the RFIC, power supply to PA 11 is OFF (power supply to LNA 41 is ON).

With reference to FIG. 2, receiving matching circuit 30 includes a circuit 31 having a fixed impedance Zs, and a semiconductor switch SW1 connected in parallel with circuit 31. Switch-on and switch-off of semiconductor switch SW1 are controlled according to, for example, a control signal from control unit 50 of FIG. 1. Impedance Zs of circuit 31 is adjusted to form a series-resonant circuit together with an input impedance of LNA 41 at an input signal angular frequency win.

In the case in which LNA 41 is constituted of a metal oxide semiconductor (MOS) transistor, an input impedance of LNA 41 is mainly an input capacitance Cin_lna (capacitance value $C_{in\_lna}$). In this case, if a circuit 21 is constituted of an inductor Ls (inductance value $L_s$), resonance angular frequency $\omega_{in}$ is given by the following formula (1).

$$\omega_{in} = \sqrt{\frac{1}{L_s \cdot C_{in\_lna}}} \qquad (1)$$

Transmitting matching circuit 20 includes circuit 21 having an impedance Zm_tx. Impedance Zm_tx is preferably variable. Impedance Zm_tx is adjusted to form a series-resonant circuit together with an impedance of antenna 4 at a frequency of a radio-frequency transmission signal at least at a time of a transmission operation in the RFIC. In the case in which impedance Zm_tx of circuit 21 is variable, circuit 21 is configured so that, for example, impedance Zm_tx varies according to a control signal from control unit 50 of FIG. 1.

[Operations of Matching Circuit]

At a time of a reception operation in the RFIC, semiconductor switch SW1 is controlled to be an off-state (open state) as shown in FIG. 2. In this case, radio-frequency reception signal 51 received by antenna 4 is input to LNA 41 through circuit 21 having impedance Zs. Impedance Zs is adjusted to form a series-resonant circuit together with an input impedance of LNA 41 at a frequency of radio-frequency reception signal 51, and thus an input signal of LNA 41 has a large amplitude. Consequently, radio-frequency reception signal 51 is input efficiently.

In the case in which impedance Zm_tx of transmitting matching circuit 20 is variable, impedance Zm_tx is adjusted so that it is higher at a time of a reception operation in the RFIC than at a time of a transmission operation in the RFIC. This can further reduce a loss of radio-frequency reception signal 51.

Figure 3:
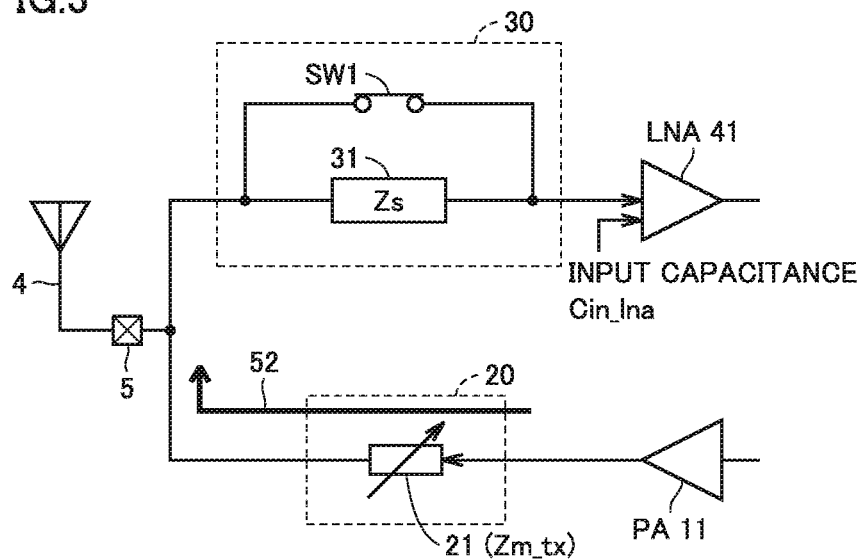
FIG. 3 is a diagram for explaining an operation of a receiving matching circuit at a time of a transmission operation.

FIG. 3 is a diagram for explaining an operation of the receiving matching circuit at a time of a transmission operation. With reference to FIG. 3, at a time of a transmission operation in the RFIC, a radio-frequency transmission signal 52 output from PA 11 is supplied to antenna 4 through transmitting matching circuit 20 (circuit 21 having impedance Zm_tx). Impedance Zm_tx is adjusted to form a series-resonant circuit together with an impedance of antenna 4 at a frequency of radio-frequency transmission signal 52, and thus radio-frequency transmission signal 52 is efficiently supplied to antenna 4.

Semiconductor switch SW1, on the other hand, is controlled to be an on-state (closed state) as shown in FIG. 3. In this case, a transmission path of a radio-frequency signal is mainly the path passing through semiconductor switch SW1, and a characteristic impedance of this path does not form a series-resonant circuit together with an input impedance of LNA 41. Accordingly, an input signal to LNA 41 has a small amplitude. Consequently, an output loss of PA 11 can be reduced.

According to the configuration and operations of receiving matching circuit 30 described above, since semiconductor switch SW1 does not lie on the transmission path of radio-frequency reception signal 51 and radio-frequency transmission signal 52, an insertion loss due to semiconductor switch SW1 does not occur. Therefore, a front-end section with a reduced loss can be achieved as compared to the conventional art.

[Modification of Matching Circuit]

Figure 4:
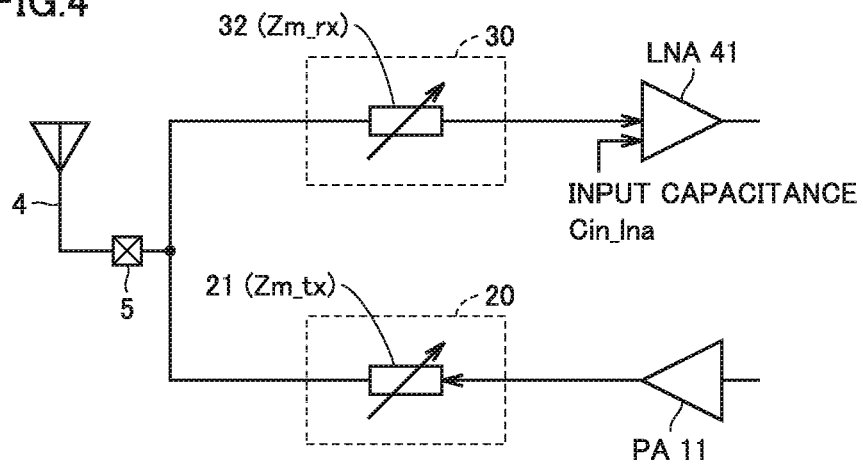
FIG. 4 is a circuit diagram showing a modification of the receiving matching circuit of FIG. 2.

FIG. 4 is a circuit diagram showing a modification of the receiving matching circuit of FIG. 2. Receiving matching circuit 30 of FIG. 4 includes a circuit 32 having a variable impedance Zm_rx. Circuit 32 is configured so that, for example, impedance Zm_rx varies according to a control signal from control unit 50 of FIG. 1. Transmitting matching circuit 20 is the same as that in FIGS. 2 and 3, and thus the same description will not be repeated.

At a time of a reception operation in the RFIC, impedance Zm_rx is adjusted to form a series-resonant circuit together with an input impedance of LNA 41. Consequently, an input signal of LNA 41 has a large amplitude, and thus radio-frequency reception signal 51 is input efficiently.

At a time of a transmission operation in the RFIC, impedance Zm_rx is adjusted to be a value different from a value at a time of a reception operation, so as not to form a series-resonant circuit together with an input impedance of LNA 41. Consequently, an input signal of LNA 41 has a small amplitude, and thus an output loss of PA 11 can be reduced.

Second Embodiment

In a second embodiment, a description is presented for a case in which the configuration of the matching circuit described in the first embodiment is applied to a transceiver for use with Bluetooth (registered trademark) Low Energy (BLE).

[Configuration of Semiconductor Device]

Figure 5:
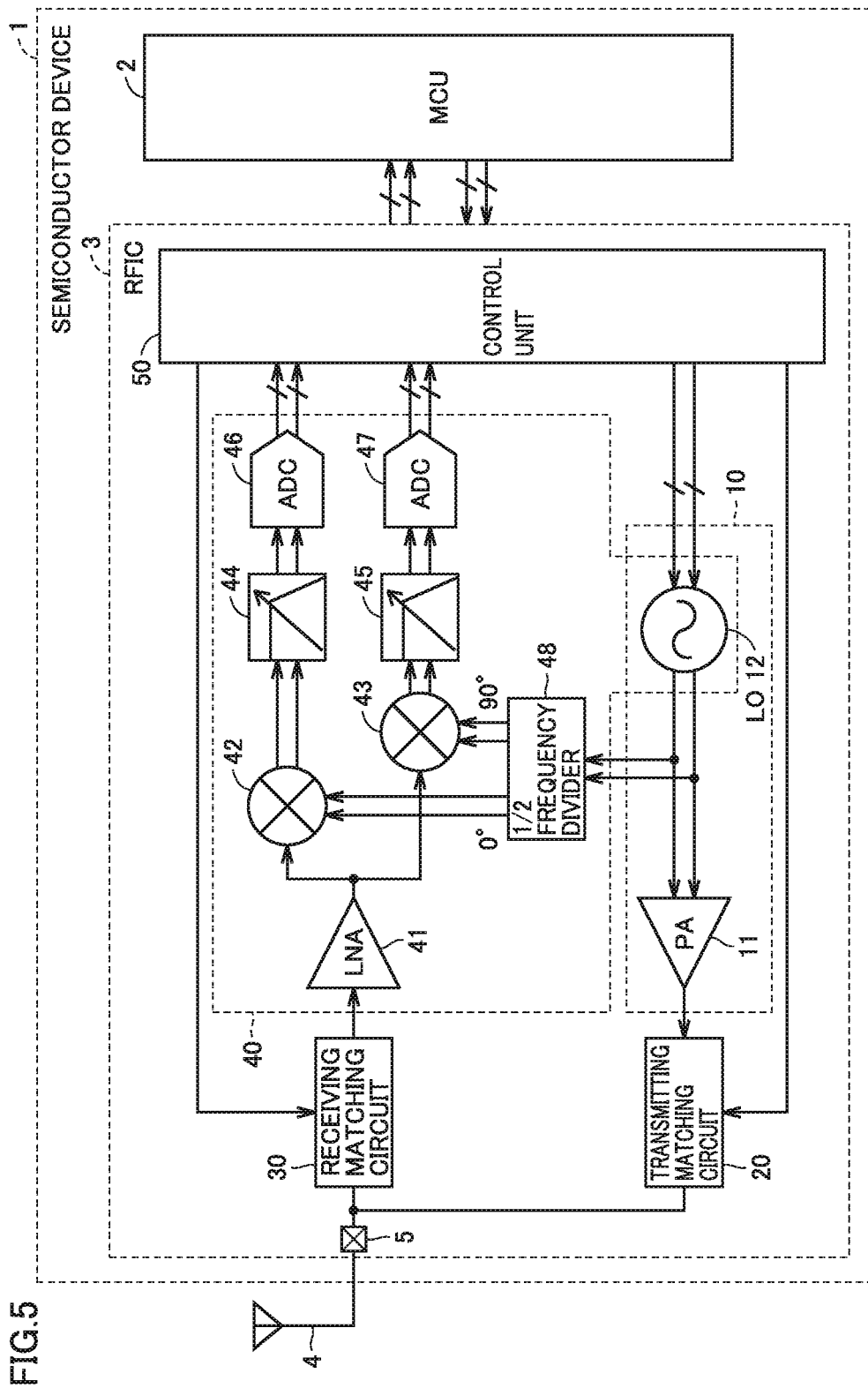
FIG. 5 is a block diagram showing a configuration of a semiconductor device 1 according to a second embodiment.

FIG. 5 is a block diagram showing a configuration of semiconductor device 1 according to the second embodiment. The basic configuration of semiconductor device 1 of FIG. 5 is similar to that of FIG. 1. That is, semiconductor device 1 includes MCU 2 and RFIC 3, and RFIC 3 includes transmitting unit 10, transmitting matching circuit 20, receiving matching circuit 30, receiving unit 40, control unit 50, and antenna connection terminal 5.

With reference to FIG. 5, transmitting unit 10 includes PA 11 and a local oscillator (LO) 12. LO 12 uses a system configured to control an oscillation frequency of a phase lock loop (PLL) frequency synthesizer by a voltage controlled oscillator (VCO). BLE uses Gaussian-filtered frequency shift keying (GFSK) modulation. Accordingly, a digital signal from control unit 50 directly controls the VCO, thereby modulating an oscillation signal of the VCO.

A radio-frequency transmission signal generated by LO 12 is amplified by PA 11 and is then supplied to antenna 4 through the transmitting matching circuit.

Receiving unit 40 converts a radio-frequency reception signal into a baseband signal by quadrature demodulation. The local oscillator of transmitting unit 10 is shared by receiving unit 40, as a local oscillator necessary for the quadrature demodulation. As shown in FIG. 5, receiving unit 40 includes LNA 41, mixers 42 and 43, low pass filters (LPFs) 44 and 45, analog-to-digital converters (ADCs) 46 and 47, and a ½ frequency divider 48.

The ½ frequency divider 48 generates a first local oscillation signal and a second local oscillation signal based on an output signal of LO 12, the first and second local oscillation signals having a phase difference of 90° from each other. Mixer 42 multiplies a radio-frequency reception signal that is amplified by LNA 41 by the first local oscillation signal, and outputs the multiplication result. LPF 44 extracts a baseband signal component from an output signal of mixer 42. An output signal of LPF 44 is converted into a digital signal by ADC 46 and is taken into control unit 50. Similarly, mixer 43 multiplies a radio-frequency reception signal that is amplified by LNA 41 by the second local oscillation signal, and outputs the multiplication result. LPF 45 extracts a baseband signal component from an output signal of mixer 43. An output signal of LPF 43 is converted into a digital signal by ADC 47 and is taken into control unit 50.

Although the conversion system at transmitting unit 10 and receiving unit 40 described above is direct conversion, another system (such as a superheterodyne system) that uses an intermediate frequency (IF) signal may also be applied. Since the operations of control unit 50 and MCU 2 are similar to those of the first embodiment, the description thereof is not repeated.

[Configuration and Operations of Matching Circuit]

Figure 6:
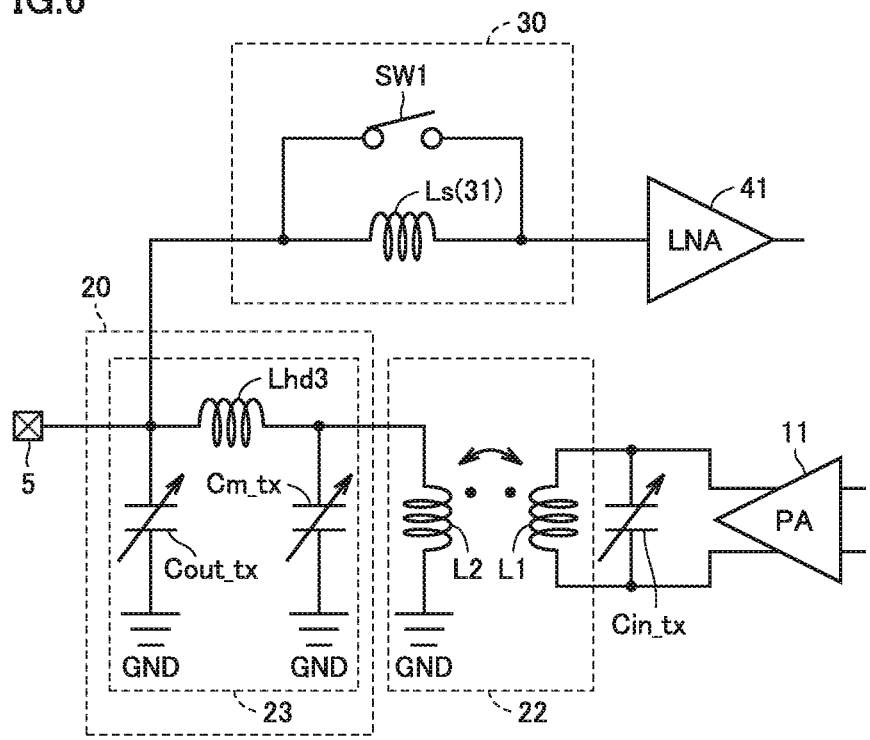
FIG. 6 is a circuit diagram showing a further detailed configuration of the front-end section of FIG. 5.

FIG. 6 is a circuit diagram showing a further detailed configuration of the front-end section of FIG. 5.

FIG. 6 shows a balun 22 and a variable capacitive element Cin_tx in addition to antenna 4, antenna connection terminal 5, transmitting matching circuit 20, receiving matching circuit 30, PA 11, and LNA 41 of FIG. 5. Further, the configuration of FIG. 6 is different from the configuration of FIG. 5 in that PA 11 is of a fully-differential type for reducing a second harmonic while LNA 41 is of a single-ended type for reducing power consumption.

With reference to FIG. 6, balun 22 is constituted of a transformer including a primary winding L1 and a secondary winding L2. To the opposite ends of primary winding L1, respective differential output terminals of PA 11 are connected. One end of secondary winding L2 is connected to a ground node GND, and the other end is connected to transmitting matching circuit 20. Balun 22 is provided to convert a differential signal that is output from PA 11, into a single-ended signal.

Variable capacitive element Cin_tx is connected in parallel with primary winding L1 of the transformer constituting balun 22. Capacitance value $C_{in\_tx}$ of variable capacitive element Cin_tx is adjusted so that variable capacitive element Cin_tx and primary winding L1 (inductance value $L_1$) form a parallel-resonant circuit. A parallel resonance angular frequency in this case is equal to an angular frequency $\omega_0$ of a radio-frequency transmission signal and is given by the following formula.

$$\omega_0 = \sqrt{\frac{1}{L_1 \cdot C_{in\_tx}}} \quad (2)$$

The transmitting matching circuit includes a π-type LC filter 23. LC filter 23 includes an inductor Lhd3, a variable capacitive element Cm_tx, and a variable capacitive element Cout_tx. Inductor Lhd3 is connected between secondary winding L2 of balun 22 and antenna connection terminal 5. Variable capacitive element Cm_tx is connected between one end of inductor Lhd3 and ground node GND, and variable capacitive element Cout_tx is connected between the other end of inductor Lhd3 and ground node GND.

The π-type LC filter 23 is provided to remove a third harmonic output from PA 11. Where a capacitance value of variable capacitive element Cm_tx is denoted by $C_{in\_tx}$, a capacitance value of variable capacitive element Cout_tx is denoted by $C_{out\_tx}$, and an inductance value of inductor Lhd3 is denoted by $L_{hd3}$, a parallel resonance condition is given by the following formula. Capacitance values of variable capacitive elements Cm_tx and Cout_tx are adjusted to satisfy the following formula at a time of a transmission operation.

$$3\omega_0 = \cfrac{1}{\sqrt{L_{hd3} \cfrac{C_{m\_tx} \cdot C_{out\_tx}}{C_{m\_tx} + C_{out\_tx}}}} \qquad (3)$$

At a time of a reception operation, on the other hand, a capacitance value of each of variable capacitive elements Cm_tx and Cout_tx is set to a minimum settable value in order to reduce a loss of a radio-frequency reception signal. That is, an impedance of transmitting matching circuit 20 is set to a value larger than a value at a time of a transmission operation.

Further, at a time of a reception operation, a signal of a specific angular frequency component $\omega_{notch}$ of a reception signal can be removed by an adjustment of a capacitance value of variable capacitive element Cin_tx. Specifically, where an inductance value of primary winding L1 of balun 22 is denoted by $L_1$, an inductance value of primary winding L2 is denoted by L2, an inductance value of inductor Lhd3 is denoted by $L_{hd3}$, and a capacitance value of variable capacitive element Cin_tx is denoted by $C_{in\_tx}$, angular frequency component $\omega_{notch}$ to be removed is given by the following formula. The following formula can be derived under the condition that inductor Lhd3, secondary winding L2, and capacitive element Cin_tx (a value converted to correspond to the secondary side of the transformer is used as a capacitance value) form a series-resonant circuit.

$$\omega_{notch} = \sqrt{\cfrac{L_{hd3} + L_2}{L_1 L_{hd3} C_{in\_tx}}} \qquad (4)$$

In the case in which receiving unit 40 uses a system using an intermediate frequency (IF) signal, such as a superheterodyne system, image waves in addition to desired waves are converted into the same IF bandwidth. In this case, image waves, which are undesired signals, can be removed by using the method described above.

[Example Configuration of Variable Capacitive Element, PA 11, and LNA 41]

An example configuration of a variable capacitive element, PA 11, and LNA 41 is described hereinbelow.

Figure 7:
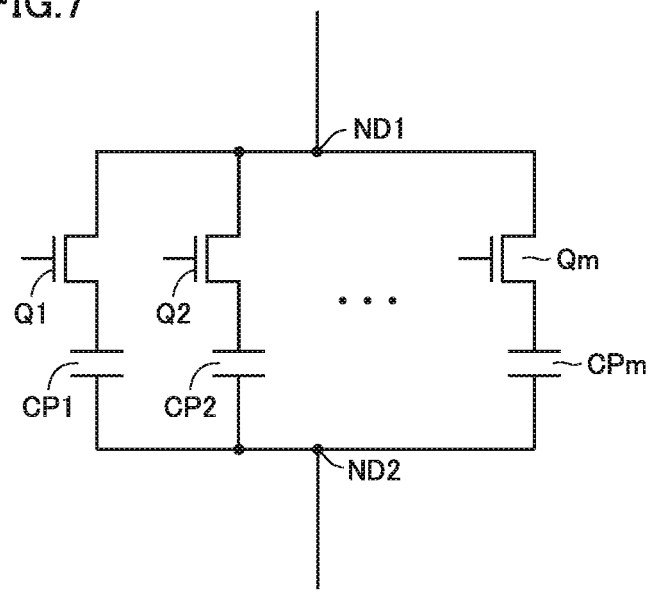
FIG. 7 is a circuit diagram showing an example configuration of a variable capacitive element.

FIG. 7 is a circuit diagram showing an example configuration of a variable capacitive element. With reference to FIG. 7, the variable capacitive element includes m capacitive elements CP1, CP2, . . . , CPm connected in parallel between a node ND1 and a node ND2, and includes m semiconductor switches Q1, Q2, . . . , Qm respectively corresponding to capacitive elements CP1, CP2, . . . , CPm. Each semiconductor switch is connected in series with the corresponding capacitive element. A capacitance value of the variable capacitive element can be adjusted by switching semiconductor switches Q1, Q2, . . . , Qm on or off.

Figure 8:
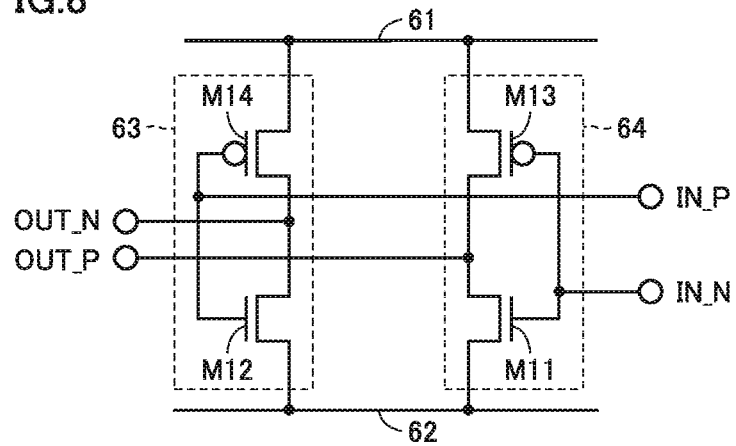
FIG. 8 is a circuit diagram showing an example configuration of the PA of FIG. 5.

FIG. 8 is a circuit diagram showing an example configuration of the PA of FIG. 5. With reference to FIG. 8, PA 11 is configured by connecting two push-pull Class-D amplifiers 63 and 64 in parallel.

Specifically, amplifier 63 includes a P-channel MOS (PMOS) transistor M14 and an N-channel MOS (NMOS) transistor M12 connected in series with each other between a power line bland a ground line 62. The gates of transistors M14 and M12 are connected to an input node IN_P on the positive side, and the drains of transistors M14 and M12 are connected to an output node OUT_N on the negative side.

Similarly, amplifier 64 includes a PMOS transistor M13 and an NMOS transistor M11 connected in series with each other between power line 61 and ground line 62. The gates of transistors M13 and M11 are connected to an input node IN_N on the negative side, and the drains of transistors M13 and M11 are connected to an output node OUT_P on the positive side.

Figure 9:
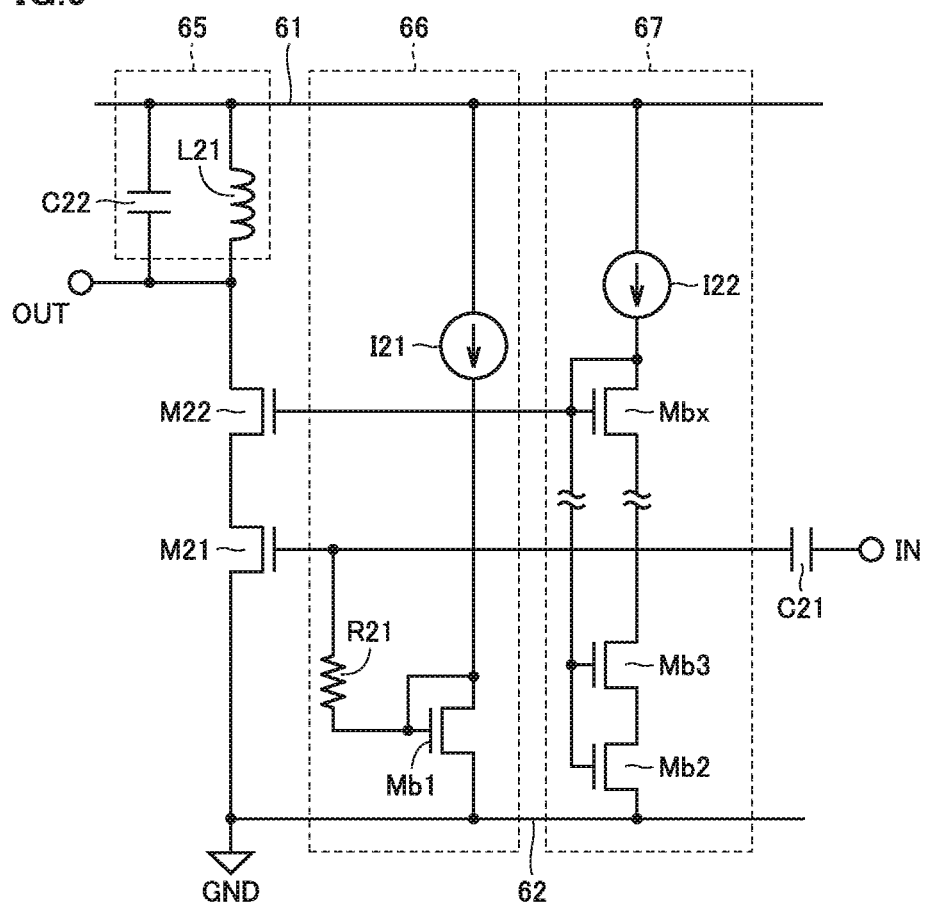
FIG. 9 is a circuit diagram showing an example configuration of the LNA of FIG. 5.

FIG. 9 is a circuit diagram showing an example configuration of the LNA of FIG. 5. With reference to FIG. 9, LNA 41 includes NMOS transistors M21 and M22, a load impedance 65, a bias setting circuit 66 for transistor M21, a bias setting circuit 67 for transistor M22, and a capacitor C21 for signal input.

Transistors M21 and M22 and load impedance 65 are connected in series in this order between ground line 62 and power line 61, thereby forming a so-called cascode amplifier circuit. Load impedance 65 includes an inductor L21 and a capacitor C22 connected in parallel with each other. The connection node (the drain of transistor M22) of transistor M22 and load impedance 65 is connected to an output node OUT. The gate of transistor M21 is connected to an input node IN, with capacitor C21 lying between the gate of transistor M21 and input node IN.

Bias setting circuit 66 includes a current source 121, an NMOS transistor Mb1, and a resistance element R21. Transistor Mb1 and current source 121 are connected in series in this order between ground line 62 and power line 61. The gate of transistor Mb1 is connected to its own drain and is also connected to the gate of transistor M21, with resistance element R21 lying between the gates of transistors Mb1 and M21.

Bias setting circuit 67 includes a current source 122 and NMOS transistors Mb2, Mb3, . . . , Mbx. Transistors Mb2, Mb3, . . . , Mbx and current source 122 are connected in series in this order between ground line 62 and power line 61. The drain of transistor Mbx is connected to the gates of transistors Mb2, Mb3, . . . , Mbx and is also connected to the gate of transistor M22.

Advantageous Effects

The front-end section with the above-described configuration brings about the following advantageous effects.

(1) PA 11 constituted of a fully-differential amplifier, to which and from which a differential signal is input and output, allows even harmonics included in an output signal of PA 11 to be cancelled, and thus a second harmonic component can be reduced.

(2) Having on-chip balun 22 allows the number of parts to be reduced and also allows the footprint on the printed circuit board to be reduced.

(3) Having on-chip π-type LC filter 23 allows a third harmonic component included in an output signal of PA 11 to be reduced. Further, the number of parts can be reduced and also the footprint on the printed circuit board can be reduced compared to a case with an external LC filter.

(4) Receiving matching circuit 30 constituted of inductor Ls and semiconductor switch SW1 connected in parallel with each other can enhance a gain of the entire receiver at a time of a reception operation, and can also reduce an output loss of PA 11 at a time of a transmission operation.

Third Embodiment

Figure 10:
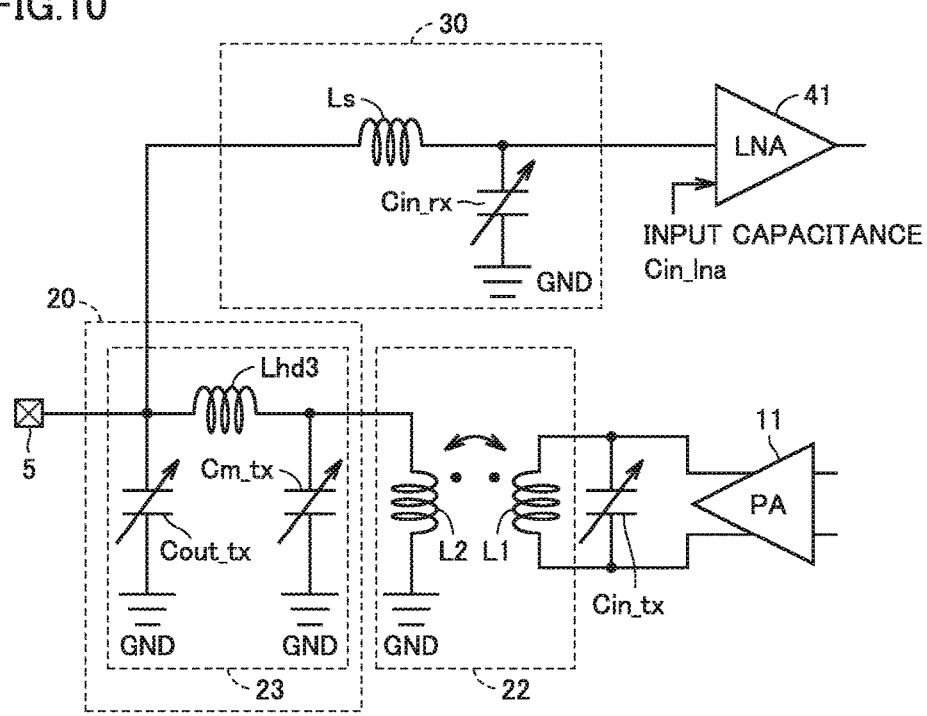
FIG. 10 is a circuit diagram showing a configuration of the front-end section of an RFIC for use in a semiconductor device of a third embodiment.

FIG. 10 is a circuit diagram showing a configuration of the front-end section of an RFIC for use in a semiconductor device of a third embodiment. The configuration of the front-end section of FIG. 10 is different from that of FIG. 6 in feature of receiving matching circuit 30. Other features of FIG. 10 are the same as those of FIG. 6, and thus identical or equivalent components are denoted by identical reference characters and the description thereof is not repeated.

With reference to FIG. 10, receiving matching circuit 30 includes inductor Ls connected between antenna connection terminal 5 and an input node of LNA 41, and a variable capacitive element Cin_rx connected between the input node of LNA 41 and ground node GND.

Capacitance value $C_{in\_rx}$ of variable capacitive element Cin_rx is adjusted so that inductor Ls (inductance value $L_s$), variable capacitive element Cin_rx, and input capacitance Cin_lna (fixed capacitance) do not form a series-resonant circuit at angular frequency $\omega_{in}$ of a radio-frequency input signal at a time of a transmission operation. This can reduce an output loss of PA 11.

At a time of a reception operation, on the other hand, capacitance value $C_{in\_rx}$ of variable capacitive element Cin_rx is adjusted so that inductor Ls (inductance value $L_s$), variable capacitive element Cin_rx, and input capacitance Cin_lna (capacitance value $C_{in\_lna}$) form a series-resonant circuit at signal angular frequency $\omega_0$. Resonance angular frequency $\omega_{in}$ in this case is given by the following formula.

$$\omega_{in} = \frac{1}{\sqrt{L_s \cdot (C_{in\_rx} + C_{in\_lna})}} \quad (5)$$

According to Formula (5), a frequency at which an amplitude of an input signal of LNA 41 is maximum can be varied by varying capacitance value $C_{in\_rx}$ of variable capacitive element Cin_rx. Accordingly, the semiconductor device of the third embodiment can broaden the range of frequencies that can ensure good receiving characteristics. Further, tolerance for manufacturing variations of capacitive elements can be enhanced, and thus yields can be raised. Other advantageous effects of the third embodiment are similar to those of the second embodiment, and the description thereof is not repeated.

Fourth Embodiment

Figure 11:
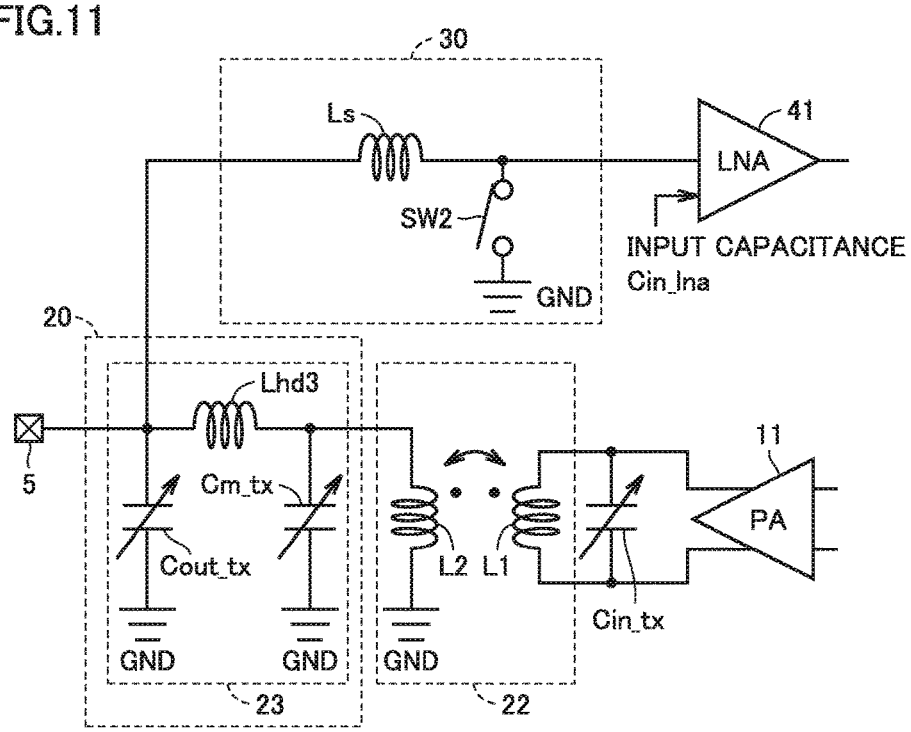
FIG. 11 is a circuit diagram showing a configuration of the front-end section of an RFIC for use in a semiconductor device of a fourth embodiment.

FIG. 11 is a circuit diagram showing a configuration of the front-end section of an RFIC for use in a semiconductor device of a fourth embodiment. The front-end section of FIG. 11 corresponds to that of FIG. 10 except that a semiconductor switch SW2 is substituted for variable capacitive element Cin_rx of FIG. 10. Other features of FIG. 11 are the same as those of FIG. 10 (therefore FIG. 6), and thus identical or equivalent components are denoted by identical reference characters and the description thereof will not be repeated.

Inductance value $L_s$ of inductor Ls is adjusted so that inductor Ls and input capacitance Cin_lna (capacitance value $C_{in\_lna}$) form a series-resonant circuit at angular frequency $\omega_{in}$ of a radio-frequency input signal. Resonance angular frequency $\omega_{in}$ in this case is given by aforementioned Formula (1).

At a time of a transmission operation, semiconductor switch SW2 is switched on, so that inductor Ls (inductance value $L_s$) and input capacitance Cin_lna (capacitance value $C_{in\_lna}$) do not form a series-resonant circuit at angular frequency $\omega_{in}$ of a radio-frequency input signal. This can reduce an output loss of PA 11. At a time of a reception operation, on the other hand, semiconductor switch SW2 is switched off in principle, so that inductor Ls (inductance value $L_s$) and input capacitance Cin_lna (capacitance value $C_{in\_lna}$) form a series-resonant circuit at angular frequency $\omega_{in}$ of a radio-frequency input signal. This can raise the efficiency of reception of a radio-frequency input signal.

If very strong undesired waves are received along with desired waves at a time of a reception operation, semiconductor switch SW2 is switched on so as to reduce an amplitude of an input signal to LNA 21. This can prevent LNA 41 from being saturated and can maintain linear amplification characteristics. Other advantageous effects of the fourth embodiment are similar to those of the second embodiment, and the description thereof is not repeated.

Fifth Embodiment

Figure 12:
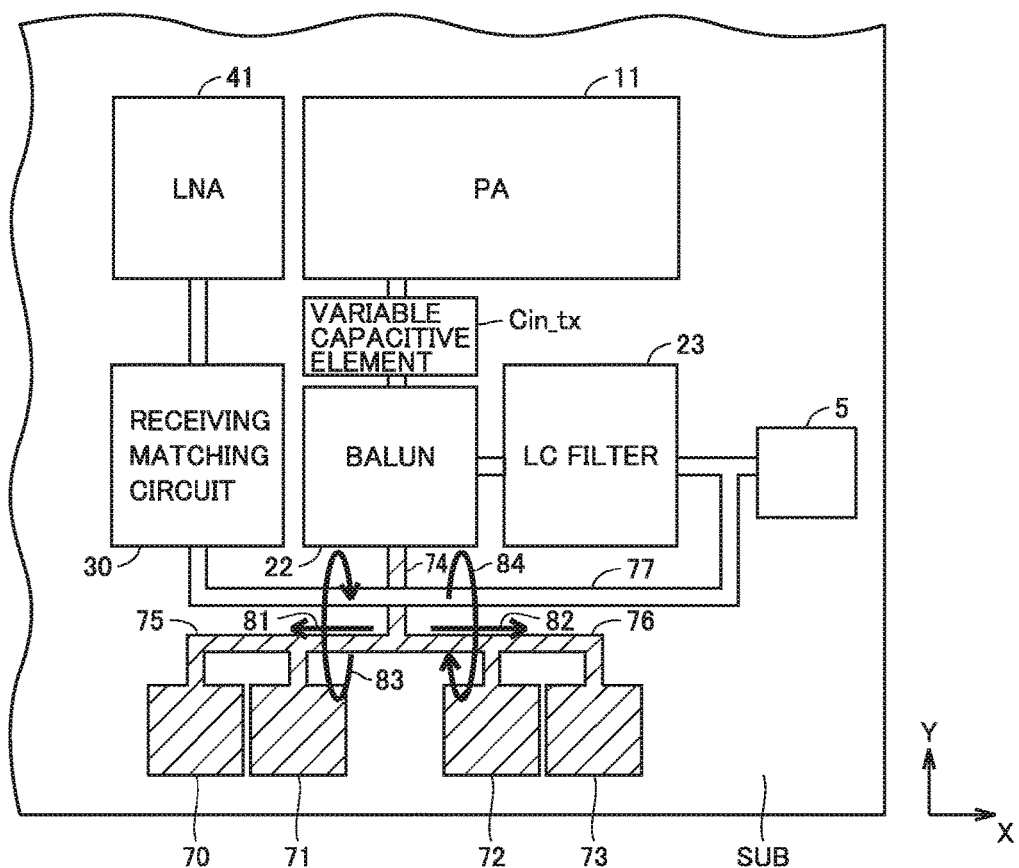
FIG. 12 is a plan view showing an example layout of the front-end section of FIG. 6.

In a fifth embodiment, a layout of the front-end section described in the second embodiment is described. FIG. 12 is a plan view showing an example layout of the front-end section of FIG. 6.

With reference to FIG. 12, antenna connection terminal 5 and ground terminals 70-73 are provided on a periphery of a semiconductor substrate SUB. Antenna connection terminal 5 and ground terminals 70-73 are used as bonding pads to connect to a lead frame of the semiconductor package. In the case of FIG. 12, antenna connection terminal 5 is disposed at the end of the semiconductor substrate in the positive X direction, and ground terminals 70-73 are disposed at the end of the semiconductor substrate in the negative Y direction.

PA 11, variable capacitive element Cin_tx, balun 22, and LC filter 23 are disposed centrally on semiconductor substrate SUB relative to antenna connection terminal 5 and are disposed close to antenna connection terminal 5. It is in order to reduce a loss of a radio-frequency transmission signal as much as possible that the aforementioned blocks, such as PA 11, are disposed close to antenna connection terminal 5.

LNA 11 and receiving matching circuit 30 are arranged farther from antenna connection terminal 5 than the aforementioned blocks, such as PA 11. Accordingly, a signal line 77 extending in the X direction is provided to connect receiving matching circuit 30 with antenna connection terminal 5. In order to reduce the circuit area, LNA 11 and receiving matching circuit 30 are arranged close to the aforementioned circuit blocks, such as PA 11.

Ground terminals 70-73 are connected to one end of the secondary winding (L2 in FIG. 6) of balun 22. Since a relatively large current flows through the secondary winding of balun 22, the secondary winding is connected to a plurality of ground terminals.

The fifth embodiment is characterized by the layout of a ground line connecting the secondary winding of balun 22 with ground terminals 70-73. Specifically, as shown in FIG. 12, a ground line 74 led out from balun 22 branches into a first ground line 75 extending in the negative X direction and a second ground line 76 extending in the positive X direction, opposite to the negative X direction. First ground line 75 is connected to ground terminals 70 and 71, and second ground line 76 is connected to ground terminals 72 and 73. Ground lines 75 and 76 are arranged along signal line 77.

According to the layout of the above-descried ground line, a current 81 flowing through first ground line 75 generates a magnetic field 83, and magnetic field 83 causes an induced current to flow through signal line 77. Further, a current 82 flowing through second ground line 76 generates a magnetic field 84, and magnetic field 84 causes an induced current to flow through signal line 77. Currents 81 and 82, however, flow in opposite directions with substantially the same amplitude (hence they have opposite phases), and accordingly the induced currents generated in signal line 77 due to magnetic fields 83 and 84 cancel each other out. Therefore, a total induced current flowing into LNA 41 is zero, and an output loss of PA 11 can be reduced at a time of a transmission operation. Such advantageous effects are important especially in the case of the circuit configuration shown in FIG. 6, where the signal path leading to LNA 41 is not broken by semiconductor switch SW1 at a time of a transmission operation.

Figure 13:
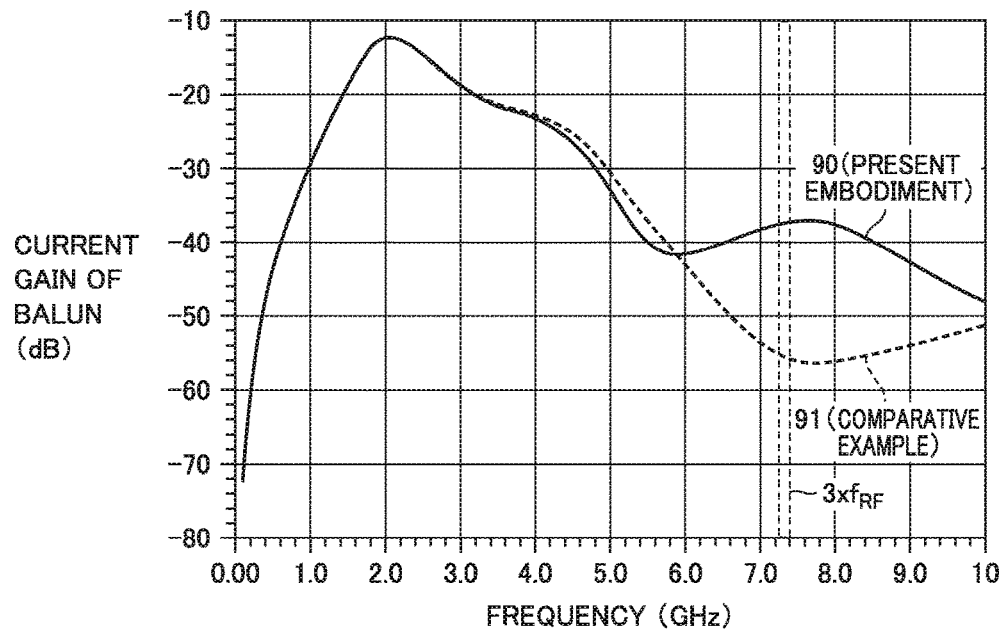
FIG. 13 shows frequency characteristics of current gains of a balun.

FIG. 13 shows frequency characteristics of current gains of the balun. In FIG. 13, characteristics in the case of the layout of the front-end section of the present embodiment are denoted by a solid line 90, while characteristics of a comparative example are denoted by a broken line 91, the comparative example corresponding to FIG. 12 except that ground terminals 72 and 73 and second ground line 76 are not provided. In the case of the comparative example, a deterioration is produced in characteristics of a third harmonic, which is three times the frequency $f_{RF}$ of a transmission signal, whereas, in the present embodiment, the characteristics can be improved.

Sixth Embodiment

Figure 14:
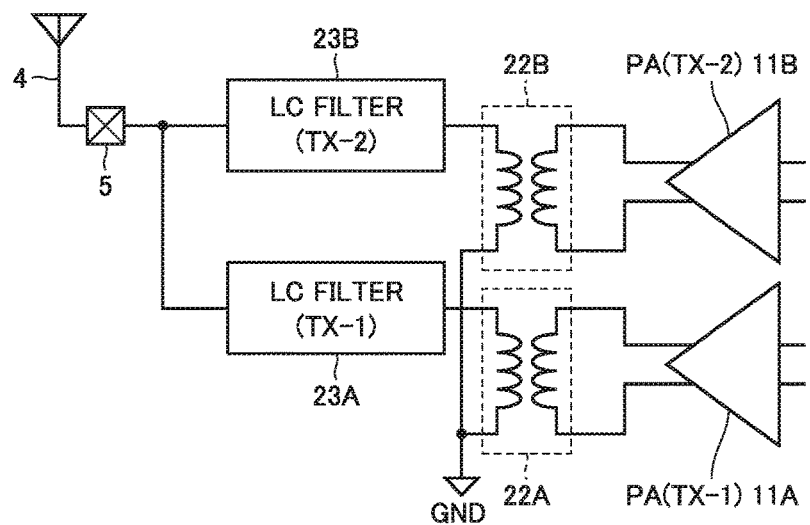
FIG. 14 is a circuit diagram showing a configuration of the front-end section of an RFIC provided in a semiconductor device of a sixth embodiment.

A sixth embodiment describes a modification of the fifth embodiment. FIG. 14 is a circuit diagram showing a configuration of the front-end section of an RFIC provided in a semiconductor device according to the sixth embodiment.

With reference to FIG. 14, the semiconductor device of the present embodiment has a transmitting front-end section with two systems (TX-1 and TX-2) to allow output of radio-frequency transmission signals having different frequencies and/or modulation systems. That is, the front-end section includes PAs 11A and 11B, baluns 22A and 22B, LC filters 23A and 23B, and common antenna connection terminal 5 to be connected to antenna 4. Power supply to one of PAs 11A and 11B that is in use is ON, and power supply to the other of PAs 11A and 11B that is not in use is OFF.

A radio-frequency differential signal output from PA 11A is converted into a single-ended signal by balun 22A and is then supplied to antenna 4 through LC filter 23A. Similarly, a radio-frequency differential signal output from PA 11B is converted into a single-ended signal by balun 22B and is then supplied to antenna 4 through LC filter 23B.

Figure 15:
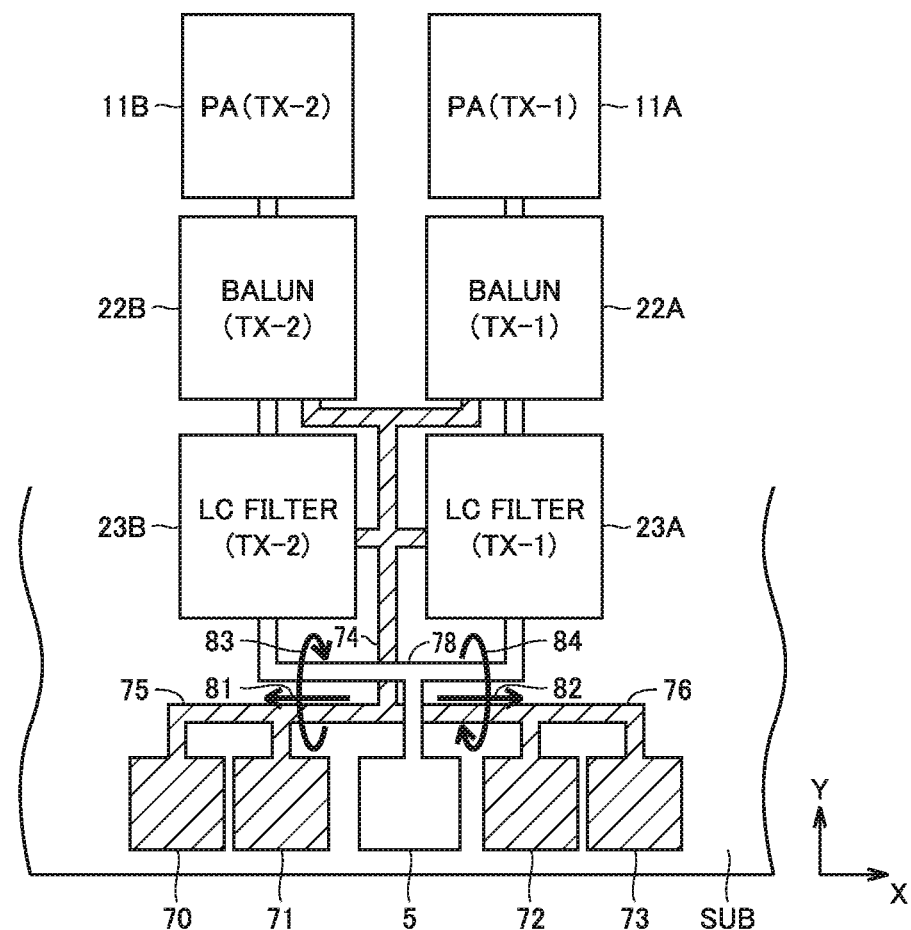
FIG. 15 is a plan view showing a layout of the front-end section of FIG. 14.

FIG. 15 is a plan view showing a layout of the front-end section of FIG. 14. With reference to FIG. 15, antenna connection terminal 5 and ground terminals 70-73 to be used as bonding pads are provided on a periphery (at the end in the negative Y direction in the case of FIG. 15) of semiconductor substrate SUB.

LC filter 23A, balun 22A, and PA 11A are arranged in this order in the direction from antenna connection terminal 5 to the center of semiconductor substrate SUB (in the positive Y direction). Further, LC filter 23B, balun 22B, and PA 11B are arranged in the X direction with respect to LC filter 23A, balun 22A, and PA 11A, respectively. LC filter 23A and LC filter 23B are connected to each other with a signal line 78 extending in the X direction. Signal line 78 is connected to antenna connection terminal 5.

Ground line 74 for baluns 22A and 22B and LC filters 23A and 23B is arranged so as to extend in the Y direction between LC filters 23A and 23B. This is because, in order that LC filters 23A and 23B can reliably show resonance characteristics, ground line 74 needs to be close to both LC filters 23A and 23B and thus ground line 74 needs to be arranged between LC filters 23A and 23B.

Ground line 74 branches into first ground line 75 extending in the negative X direction and second ground line 76 extending in the positive X direction, opposite to the negative X direction. First ground line 75 is connected to ground terminals 70 and 71, and second ground line 76 is connected to ground terminals 72 and 73. Ground lines 75 and 76 are arranged along signal line 78.

In the case of the above-described layout of the ground line, current 81 through first ground line 75 and current through second ground line 76 flow in opposite directions with substantially the same amplitude (hence they have opposite phases), and accordingly induced currents generated in signal line 78 due to magnetic fields 83 and 84 cancel each other out, similarly to the case of FIG. 12. Therefore, an induced current flowing into one of PAs 11A and 11B that is not in use is zero, and an output loss of an in-use PA can be reduced.

The present invention made by the inventors has been concretely described above based on the embodiments. It goes without saying, however, that the present invention is not limited to the above-described embodiments but may be modified in various manners within a range without departing from the gist of the present invention.

REFERENCE SIGNS LIST

1: semiconductor device; 2: MCU; 3: RFIC; 4: antenna; 5: antenna connection terminal; 10: transmitting unit; 20: transmitting matching circuit; 21, 31, 32: circuit; 22, 22A, 22B: balun; 23, 23A, 23B: LC filter; 30: receiving matching circuit; 40: receiving unit; 50: control unit; 51: radio-frequency reception signal; 52: radio-frequency transmission signal; 70, 71, 72, 73: ground terminal; 74, 75, 76: ground line; 77, 78: signal line; SW1, SW2: semiconductor switch; SUB: semiconductor substrate

The invention claimed is:

1. A semiconductor device, comprising:
   an antenna connection terminal to be connected to an antenna;
   a transmitting unit configured to convert a baseband transmission signal into a radio-frequency transmission signal;
   a transmitting matching circuit connected between the antenna connection terminal and the transmitting unit and configured to match an impedance of the antenna;
   a receiving unit configured to convert a radio-frequency reception signal received by the antenna into a baseband reception signal, the receiving unit including a first stage provided with a low-noise amplifier; and
   a receiving matching circuit connected between the antenna connection terminal and an input terminal of the low-noise amplifier, the receiving matching circuit including:
      a first circuit connected between the antenna connection terminal and the input terminal of the low-noise amplifier and having a fixed impedance; and
      a first semiconductor switch connected between an input terminal and an output terminal of the first circuit,
   wherein, at a time of a reception operation in which the radio-frequency reception signal is received by the receiving unit, the first semiconductor switch is controlled to be an off-state,
   wherein, at a time of a transmission operation in which the radio-frequency transmission signal is transmitted from the transmitting unit, the first semiconductor switch is controlled to be an on-state, wherein the impedance of the first circuit forms a series-resonant circuit together with an input capacitance of the low-noise amplifier at a frequency of the radio-frequency reception signal, wherein the transmitting unit includes a final stage provided with a power amplifier that comprises a fully-differential amplifier to which and from which a differential signal is input and output, wherein the semiconductor device further comprises a balun configured to convert a differential output signal of the power amplifier into a single-ended signal, wherein the balun comprises a transformer including a primary winding and a secondary winding, wherein opposite ends of the primary winding are connected to respective differential output nodes of the power amplifier, wherein one end of the secondary winding is grounded, wherein an other end of the secondary winding is connected to the transmitting matching circuit, wherein the antenna connection terminal, the transmitting unit, the receiving unit, the transmitting matching circuit, the receiving matching circuit, and the balun are provided on an identical semiconductor substrate, wherein a first ground terminal, a second ground terminal, and a ground line are further provided on the semiconductor substrate, the ground line being connected to the other end of the secondary winding, and wherein the ground line includes:
  a first line extending in a first direction, wherein one end of the first line is connected to the other end of the secondary winding and an other end of the first line is connected to the first ground terminal; and
  a second line extending in a second direction opposite to the first direction wherein one end of the second line is connected to the other end of the secondary winding and an other end of the second line is connected to the second ground terminal.

2. The semiconductor device according to claim 1, further comprising a first capacitive element connected in parallel with the primary winding of the balun and having a variable capacitance value,
  wherein, at the time of the transmission operation, the primary winding of the balun and the first capacitive element form a parallel-resonant circuit at a frequency of the radio-frequency transmission signal.

3. The semiconductor device according to claim 2, wherein, at the time of the reception operation, the capacitance value of the first capacitive element is varied depending on a frequency of an undesired wave to be removed.

4. A semiconductor device, comprising:
an antenna connection terminal to be connected to an antenna;
a transmitting unit configured to convert a baseband transmission signal into a radio-frequency transmission signal;
a transmitting matching circuit connected between the antenna connection terminal and the transmitting unit and configured to match an impedance of the antenna;
a receiving unit configured to convert a radio-frequency reception signal received by the antenna into a baseband reception signal, the receiving unit including a first stage provided with a low-noise amplifier; and
a receiving matching circuit connected between the antenna connection terminal and an input terminal of the low-noise amplifier, the receiving matching circuit including:
  a first circuit connected between the antenna connection terminal and the input terminal of the low-noise amplifier and having a fixed impedance; and
  a first semiconductor switch connected between an input terminal and an output terminal of the first circuit, wherein, at a time of a reception operation in which the radio-frequency reception signal is received by the receiving unit, the first semiconductor switch is controlled to be an off-state, wherein, at a time of a transmission operation in which the radio-frequency transmission signal is transmitted from the transmitting unit, the first semiconductor switch is controlled to be an on-state, wherein the impedance of the first circuit forms a series-resonant circuit together with an input capacitance of the low-noise amplifier at a frequency of the radio-frequency reception signal, wherein the transmitting unit includes a final stage provided with a power amplifier that comprises a fully-differential amplifier to which and from which a differential signal is input and output, wherein the semiconductor device further comprises a balun configured to convert a differential output signal of the power amplifier into a single-ended signal, wherein the transmitting matching circuit includes an LC filter configured to remove a third harmonic of the radio-frequency transmission signal, wherein the LC filter includes:
  an inductor element;
  a second capacitive element connected between one end of the inductor element and a ground node; and
  a third capacitive element connected between an other end of the inductor element and a ground node, wherein the second capacitive element and the third capacitive element each have a variable capacitance value, and wherein, at the time of the reception operation, the capacitance value of each of the second capacitive element and the third capacitive element is set to a minimum settable capacitance value.

5. A semiconductor device, comprising:
an antenna connection terminal to be connected to an antenna;
a transmitting unit configured to convert a baseband transmission signal into a radio-frequency transmission signal;
a transmitting matching circuit connected between the antenna connection terminal and the transmitting unit and configured to match an impedance of the antenna;
a receiving unit configured to convert a radio-frequency reception signal received by the antenna into a baseband reception signal, the receiving unit including a first stage provided with a low-noise amplifier; and
a receiving matching circuit connected between the antenna connection terminal and an input terminal of the low-noise amplifier, the receiving matching circuit including:
  a first circuit connected between the antenna connection terminal and the input terminal of the low-noise amplifier and having a fixed impedance; and a first semiconductor switch connected between an input terminal and an output terminal of the first circuit,
wherein the semiconductor device further comprises a transformer including a primary winding and a secondary winding,
wherein one end of the secondary winding is grounded,
wherein an other end of the secondary winding is connected to the transmitting matching circuit,
wherein a first ground terminal, a second ground terminal, and a ground line are further provided on the semiconductor substrate, the ground line being connected to the other end of the secondary winding, and
wherein the ground line includes:
  a first line extending in a first direction, wherein one end of the first line is connected to the other end of the secondary winding and an other end of the first line is connected to the first ground terminal; and
  a second line extending in a second direction opposite to the first direction, wherein one end of the second line is connected to the other end of the secondary winding and an other end of the second line is connected to the second ground terminal.

* * * * *